United States Patent
Qiu et al.

(10) Patent No.: US 9,685,393 B2
(45) Date of Patent: Jun. 20, 2017

(54) PHASE-CHANGE CHAMBER WITH PATTERNED REGIONS OF HIGH AND LOW AFFINITY TO A PHASE-CHANGE MEDIUM FOR ELECTRONIC DEVICE COOLING

(71) Applicant: The Hong Kong University of Science and Technology, Clear Water Bay, Kowloon (HK)

(72) Inventors: Huihe Qiu, Hong Kong (CN); Zhen Sun, Hong Kong (CN); Xiaodan Chen, Hong Kong (CN); Bin Wang, Hong Kong (CN)

(73) Assignee: The Hong Kong University of Science and Technology, Kowloon (HK)

( * ) Notice: Subject to any disclaimer, the term of this patent is extended or adjusted under 35 U.S.C. 154(b) by 416 days.

(21) Appl. No.: 14/173,986

(22) Filed: Feb. 6, 2014

(65) Prior Publication Data
US 2014/0247557 A1   Sep. 4, 2014

Related U.S. Application Data

(60) Provisional application No. 61/851,199, filed on Mar. 4, 2013.

(51) Int. Cl.
*H05K 7/20*  (2006.01)
*H01L 23/46* (2006.01)
(Continued)

(52) U.S. Cl.
CPC .......... *H01L 23/46* (2013.01); *F28D 15/0233* (2013.01); *F28F 13/187* (2013.01);
(Continued)

(58) Field of Classification Search
CPC ................ H01L 23/46; H01L 23/427; H01L 2924/0002; H01L 23/3735; F28D 15/0233;
(Continued)

(56) References Cited

U.S. PATENT DOCUMENTS 5,729,038 A   3/1998   Young et al.
6,165,596 A * 12/2000   Chen ................... H01L 23/3735
                                                174/250
(Continued)

OTHER PUBLICATIONS

"Evaporative heat transfer from an electrowetted liquid ribbon on a heated substrate"; International Journal of Heat and Mass Transfer 57 (2013) pp. 73-81; Christopher P. Migliaccio, Suresh V. Garimella; Oct. 31, 2012 (9 pages).
(Continued)

*Primary Examiner* — Jayprakash N Gandhi
*Assistant Examiner* — Stephen Sul
(74) *Attorney, Agent, or Firm* — Osha Liang LLP

(57) ABSTRACT

A phase-change chamber, a method for fabricating a phase-change chamber and a heat dissipation apparatus for electronic device cooling are disclosed. The phase-change chamber includes: a phase-change medium capable of transitioning between a plurality of phases; a first surface for transitioning a portion of the phase-change medium from a first phase into a second phase; a second surface for transitioning a portion of the phase-change medium from the second phase into the first phase; and at least one supporting member along the circumference of the first surface and the second surface for separating and enclosing the first surface and the second surface. The first surface is patterned on a first plate and includes regions of high and low affinity to the phase-change medium. The second surface is received on a second plate and comprises low affinity to the phase-change medium.

25 Claims, 4 Drawing Sheets

(51) Int. Cl.
   *H01L 23/427*   (2006.01)
   *F28F 13/18*    (2006.01)
   *F28D 15/02*    (2006.01)
   *H01L 23/373*   (2006.01)

(52) U.S. Cl.
   CPC ........ *H01L 23/427* (2013.01); *F28F 2225/04* (2013.01); *H01L 23/3735* (2013.01); *H01L 2924/0002* (2013.01); *Y10T 29/49764* (2015.01)

(58) Field of Classification Search
   CPC ................ F28F 13/187; F28F 2225/04; Y10T 29/49764
   USPC .................................. 361/700, 699, 689, 677
   See application file for complete search history.

(56) References Cited

U.S. PATENT DOCUMENTS

| | | | |
|---|---|---|---|
| 6,333,558 B1* | 12/2001 | Hasegawa | H01L 23/5222 257/759 |
| 6,407,922 B1 | 6/2002 | Eckblad et al. | |
| 6,637,506 B2 | 10/2003 | Gektin et al. | |
| 6,686,532 B1 | 2/2004 | Macris | |
| 7,137,442 B2 | 11/2006 | Kawahara et al. | |
| 7,732,918 B2 | 6/2010 | Dangelo et al. | |
| 7,911,052 B2 | 3/2011 | Vadakkanmaruveedu et al. | |
| 8,074,706 B2* | 12/2011 | Su | F28D 15/0233 165/104.26 |
| 8,377,214 B2 | 2/2013 | Zhang et al. | |
| 8,391,007 B2 | 3/2013 | Hashimoto et al. | |
| 8,590,154 B2 | 11/2013 | Lee | |
| 2002/0090833 A1* | 7/2002 | Matsuura | H01L 21/02137 438/781 |
| 2003/0042009 A1* | 3/2003 | Phillips | F28D 15/043 165/104.26 |
| 2007/0121299 A1* | 5/2007 | Campbell | H01L 23/3677 361/710 |
| 2007/0155025 A1* | 7/2007 | Zhang | B82Y 10/00 438/3 |
| 2008/0062651 A1* | 3/2008 | Reis | C09K 5/041 361/710 |
| 2008/0174963 A1* | 7/2008 | Chang | F28D 15/0233 361/700 |
| 2008/0283222 A1 | 11/2008 | Chang et al. | |
| 2009/0215260 A1* | 8/2009 | Jiang | H01L 21/2855 438/643 |
| 2009/0294104 A1 | 12/2009 | Lin et al. | |
| 2010/0065255 A1 | 3/2010 | Liu et al. | |
| 2010/0307003 A1 | 12/2010 | Hoffman et al. | |
| 2011/0284188 A1* | 11/2011 | Cai | F28D 15/0266 165/104.26 |
| 2012/0012804 A1* | 1/2012 | Chen | F28D 15/0233 257/2 |
| 2012/0168435 A1 | 7/2012 | Chen et al. | |
| 2013/0168050 A1* | 7/2013 | Chauhan | H01L 23/427 165/104.21 |
| 2014/0090815 A1* | 4/2014 | Salamon | F28D 15/0266 165/104.26 |

OTHER PUBLICATIONS

"Constructal design of X-shaped conductive pathways for cooling a heat-generating body"; International Journal of Heat and Mass Transfer 58 (2013); Nov. 12, 2012, pp. 513-520; G.Lorenzini, C. Biserni, L.A.O. Rocha; (8 pages).

"A novel vapor chamber and its performance"; International Journal of Heat and Mass Transfer 53 (2010), pp. 2377-2384; Shwin-Chung Wong, Kuo-Chun Hsieh, Jia-Da Wu, Wei-Lun Han; Feb. 19, 2010 (8 pages).

"Design, development and tests of high-performance silicon vapor chamber", Qingjun Cai, Bing-chung Chen and Chialun Tsai; J. Micromechanics Microengineering 22 (2012) 035009; Feb. 14, 2012 (9 pages).

"Do surfaces with mixed hydrophilic and hydrophobic areas enhance pool boiling?"; Applied Physics Letters 97, 141909 (2010); Amy Rachel Betz, Jie Xu, Huihe Qiu, and Daniel Attinger; Oct. 6, 2010 (3 pages).

* cited by examiner

PHASE-CHANGE CHAMBER WITH PATTERNED REGIONS OF HIGH AND LOW AFFINITY TO A PHASE-CHANGE MEDIUM FOR ELECTRONIC DEVICE COOLING

CROSS-REFERENCE TO RELATED APPLICATIONS

Pursuant to 35 U.S.C. §119(e), this application claims benefit of U.S. Provisional Application No. 61/851,199 filed on Mar. 4, 2013, entitled "HYDROPHOBIC AND HYDROPHILIC NETWORK PATTERNED VAPOR CHAMBER FOR ELECTRONIC COOLING." The disclosure of the U.S. Provisional Application is incorporated herein by reference in its entirety.

BACKGROUND

Dissipation or re-direction of thermal energy is required by many electronic devices. For example, a computer contains several integrated circuits, e.g. CPU (central processing unit), GPU (graphics processing unit), Chipset (e.g. Northbridge/Southbridge), DRAM (dynamic random access memory), VRM (voltage regulator) etc. that generate heat. The GPU can be combined with the CPU on a computer motherboard as an APU (advanced processing unit) or the GPU can be included as part of a discrete graphics card. Further, many lighting applications use high-powered LED's (light emitting diodes) that generate heat. This heat needs to be removed to insure the reliability of the electronic device and to prevent premature failure.

The problem of heat dissipation is exacerbated by the increasing speed of electronic devices, e.g. overclocking of computer parts. Thus, there have been many attempts at heat dissipation for electronic devices. In the most basic case, the generated heat is allowed to simply dissipate by natural thermal convection. However, one disadvantage of natural thermal convection is that the heat transfer is relatively inefficient and consequently the temperature inside the electronic device rises fairly high before it reaches a steady temperature.

One cooling solution involves attaching a heat sink to an electronic device. The heat sink typically is made of materials like aluminum or copper and includes heat sink fins to maximize the heat exchanger-to-air surface area. To improve the thermal connection between the electronic device and the heat sink, a thermal interface material (TIM) is used. The TIM can, for example, consist of a colloidal silver paste.

Another cooling solution used in many computers includes a fan that directs forced air at the heat sink described above. As the thermal conductivity and heat capacity of air is smaller than the thermal conductivity and heat capacity of water, there have been methods proposed to cool electronic devices using water flow, similar to how a car engine is cooled. Such methods typically involve a pump, a coolant reservoir, a fan moving air over the radiator and a water/coolant block in thermal connection with the electronic device.

Yet a further alternative for cooling electronic devices consists of using a Peltier element. A Peltier element is a thermoelectric device that uses supplied electric current to cool down one side while the other side gets hot. The cold side of the Peltier element is mounted to the electronic device while a heat sink is attached to the hot side.

In addition, electronic device manufacturers have employed the use of heat pipes, also referred to as vapor chambers to re-direct heat from an electronic device to the ambient environment. A heat pipe is, for example, used on some motherboards and typically connects multiple electronic devices, e.g. southbridge and voltage regulators. In addition, a heat pipe can be incorporated in CPU/GPU cooling solutions and spreads heat from the CPU/GPU to a large area heat sink to which a fan is attached.

The heat pipe is made of copper or aluminum and consists of a sealed, hollow pipe, which is on the order of about ¼ inch (about 6 mm) in diameter. Inside the heat pipe is a wick on the inside wall of the pipe and a small amount of fluid which is in equilibrium with its own vapor. As the heat is applied to one side of the heat pipe, the working fluid vaporizes and the vapor spreads to the entire inner volume and condenses over a much larger surface. The condensate then returns to the evaporator via capillary forces developed in the wick.

However, all of the described heat dissipation techniques, firstly, require relatively large equipment for heat dissipation and, secondly, do not address the disadvantage of multiple thermal interfaces that hinder an effective heat transfer from an electronic device. For example a typical CPU thermal interface stack consists of a CPU, a first thermal interface material between the CPU and the lid, the lid, a second thermal interface material, a heat sink including a heat pipe and a fan.

SUMMARY OF CLAIMED EMBODIMENTS

In general, in one aspect, one or more embodiments disclosed herein relate to a phase-change chamber. The phase-change chamber may include: a phase-change medium capable of transitioning between a plurality of phases; a first surface for transitioning a portion of the phase-change medium from a first phase into a second phase; a second surface for transitioning a portion of the phase-change medium from the second phase into the first phase; and at least one supporting member along a circumference of the first surface and the second surface for separating and enclosing the first surface and the second surface. The first surface may be patterned on a first plate and includes regions having high and low affinity to the phase-change medium. The second surface is received on a second plate and has low affinity to the phase-change medium.

In one or more embodiments, the phase-change chamber may also include at least one additional supporting member disposed between the first surface and the second surface. The additional supporting members may a) border the at least one supporting member, b) non-bordering to the at least one supporting member, or c) form an integral part of the at least one supporting member. In some embodiments, a plurality of the additional supporting members non-bordering the at least one supporting member may be arranged in a pattern, such as a square.

In one or more embodiments, the at least one supporting member may be bonded with the first surface on the first plate and the second surface on the second plate to seal the phase-change chamber, to provide structural support, and to prevent deformation of the phase-change chamber.

In one or more embodiments, the at least one additional supporting member disposed between the first surface and the second surface may be a) bordering the at least one supporting member, b) non-bordering the at least one supporting member, or c) being an integral part of the at least one supporting member, and may be bonded with the first surface on the first plate and the second surface on the second plate to provide structural support and to prevent deformation of the phase-change chamber.

In one or more embodiments, the at least one supporting member along the circumference of the first surface and the second surface may be formed from silicon. In one or more embodiments, the at least one additional supporting member may be formed from silicon. In one or more embodiments, the first plate and/or the second plate may be formed from silicon.

In one or more embodiments, the high-affinity regions of the first surface may include a silicon oxide layer. In one or more embodiments, the phase-change chamber may include a silicon oxide layer deposited onto the first plate.

In one or more embodiments, the phase-change chamber may further include a silicon oxide layer as the high-affinity regions of the first surface, and the thickness of the silicon oxide layer may be between 100 and 1000 nanometers.

In one or more embodiments, the low-affinity regions of the first surface may be hexagonal in shape.

In one or more embodiments, the low-affinity regions of the first surface and of the second surface may be formed from a hydrophobic polymer, for example a polytetrafluoroethylene, such as TEFLON® (DUPONT, Wilmington, Del.). In one or more embodiments, the low-affinity regions of the first surface and of the second surface may have a thickness between 50 and 500 nanometers.

In one or more embodiments, the phase-change chamber may further include an aluminum layer intermediate the polytetrafluoroethylene layer and the first or second plate. In one or more embodiments, the aluminum layer may have a thickness between 20 and 250 nanometers.

In one or more embodiments, the phase-change chamber may further include a surface structure layer under the aluminum layer of the second surface. In one or more embodiments, the surface structure layer may include a copper oxide layer, and the thickness of the copper oxide layer is between 1 and 10 micrometers.

In one or more embodiments, the phase-change chamber may further include a surface structure layer under the aluminum layer of the second surface, and the surface structure layer includes pillars etched into the second plate. In one or more embodiments, a pillar aspect ratio is a numeric value between 0.1 and 10.

In one or more embodiments, a pitch between the low-affinity regions may be in the range from 50 to 200 micrometers, and a size of the low-affinity region may be between 40% and 60% of the pitch.

In one or more embodiments, the phase-change medium may include at least one of water, alcohol, methanol, and mixtures thereof.

In one or more embodiments, the phase-change chamber may include an access port inserted into (disposed through) a supporting member along the circumference of the first surface and the second surface. In one or more embodiments, the access port inserted may be formed from a material such as copper, glass, stainless steel, and mixtures thereof.

In another aspect, one or more embodiments disclosed herein relate to a method for fabricating a phase-change chamber. The method may include: patterning a first surface on a first plate comprising regions of high and low affinity to a phase-change medium; receiving a second surface on a second plate comprising low affinity to the phase-change medium; bonding another plate to the second surface; processing the another plate to remove the another plate material, except at least one supporting member along the circumference of the second surface; bonding the at least one supporting member along the circumference of the second surface to the first surface; inserting an access port into the at least one supporting member along the circumference of the first surface and the second surface; evacuating the phase-change chamber through the access port; partially refilling the phase-change chamber through the access port with phase-change medium; and closing the access port.

In another aspect, one or more embodiments disclosed herein relate to a heat dissipation apparatus. The heat dissipation apparatus may include: a heat source, generating an amount of heat to be dissipated; a heat sink, for dissipating the amount of heat to the environment; and a phase-change chamber, in thermal contact with the heat source and the heat sink. The phase-change chamber may include: a phase-change medium capable of transitioning between a plurality of phases; a first surface for transitioning a portion of the phase-change medium from a first phase into a second phase; a second surface for transitioning a portion of the phase-change medium from the second phase into the first phase; and at least one supporting member along the circumference of the first surface and the second surface for separating and enclosing the first surface and the second surface. The first surface may be patterned on a first plate and comprises regions of high and low affinity to the phase-change medium, and the second surface may be received on a second plate and comprises low affinity to the phase-change medium. The first plate of the phase-change chamber is in thermal contact with the heat source and the second plate of the phase-change chamber is in thermal contact with the heat sink.

In one or more embodiments, the heat dissipation apparatus may include an electronic device, such as at least one of CPU, GPU, APU, LED, DRAM, VRM and chipset integrated circuit, as the heat source.

In one or more embodiments, the heat dissipation apparatus may include a material selected from the group consisting of copper and aluminum, and mixtures thereof as the heat sink.

In one or more embodiments, the heat dissipation apparatus may include a thermally conductive interface material positioned between the first plate of the phase-change chamber and the heat source.

In one or more embodiments, the heat dissipation apparatus may include a thermally conductive interface material positioned between the second plate of the phase-change chamber and the heat sink.

In one or more embodiments, the heat dissipation apparatus may include a heat source consisting of a silicon die mounted in flip-chip technology. Thermal contact between the heat source and the phase-change chamber may be realized by using the silicon die as the first plate.

DETAILED DESCRIPTION

Following is a detailed description of specific embodiments disclosed herein with reference to the figures. In the figures, several details are presented to further the understanding of the disclosed embodiments. However, these details may not be required or could be substituted for other details as would be known to one with ordinary skill in the art. In addition, other well-known features have not been described as not to distract from the description of the disclosed embodiments. Further, it is to be understood that individual microelectronic steps involved in fabricating the phase-change chamber can be realized using a variety of alternate methods. For example deposition of a layer can be achieved by spin coating, physical vapor deposition or chemical vapor deposition, while removal of layers or portion of layers can be achieved by wet etching or dry etching. In addition, the materials selected for fabricating the phase-change chamber can be substituted as long as they fulfill the overall concept of the embodiments disclosed herein.

Structural Description of a Phase-change Chamber

Figure 1:
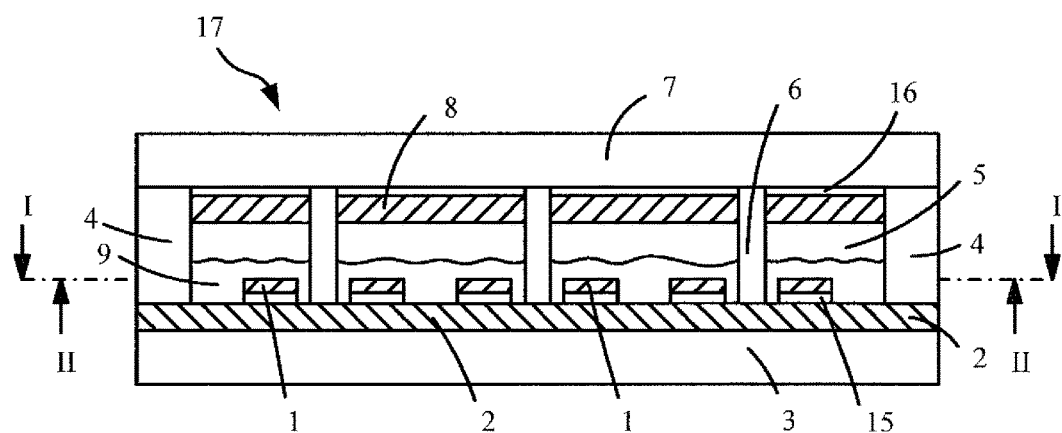
FIG. 1 shows a cross-sectional view of a phase-change chamber in accordance with one or more embodiments disclosed herein.

FIG. 1 shows a cross-sectional view of a phase-change chamber 17 in accordance with one or more embodiments herein. The phase-change chamber 17 includes a first plate 3, a second plate 7, at least one supporting member 4, a first phase 9 of a phase-change medium and a second phase 5 of the phase-change medium. The first plate 3 is also referred to as evaporator base, while the second plate 7 is also referred to as condenser base. The at least one supporting member 4 is located along the circumference of the first plate 3 and the second plate 7, thereby separating the first plate 3 and the second plate 7, and enclosing the first phase 9 and the second phase 5 of the phase-change medium. The at least one supporting member 4 is also referred to as sidewall. The combination of the first phase 9 of the phase-change medium and the second phase 5 of the phase-change medium is also referred to as phase-change medium or working medium, and is disposed inside the phase-change chamber 17 as shown in FIG. 1. The space inside the phase-change chamber 17 occupied by the phase-change medium is also referred to as cavity of the phase-change chamber 17.

Further, FIG. 1 shows a layer 2 of high-affinity to the phase-change medium deposited onto the first plate 3. The layer 2 of high-affinity to the phase-change medium is covered only in some patterned regions with a layer 1 of low-affinity to the phase-change medium. The combination of the first plate 3, the layer 2 of high-affinity to the phase-change medium, and the layer 1 of low-affinity to the phase-change medium is also referred to as the evaporator section of the phase-change chamber 17. Specifically, the combined surface of the low-affinity regions and the high-affinity regions exposed to the phase-change medium of the evaporator section is also referred to as a first surface. The first surface is for transitioning a portion of the phase-change medium from the first phase 9 of the phase-change medium into the second phase 5 of the phase-change medium.

In addition, FIG. 1 illustrates a layer 8 of low-affinity to the phase-change medium disposed on the second plate 7. While the layer 8 of low-affinity to the phase-change medium is illustrated as extending only a part of the length of the second plate 7, the layer 8 of low-affinity to the phase-change medium can also extend the full length of the second plate 7. The combination of the second plate 7 and the layer 8 of low-affinity to the phase-change medium is also referred to as condenser section of the phase-change chamber 17. Specifically, the surface of the layer 8 of low-affinity of the condenser section is also referred to as a second surface. The second surface is for transitioning a portion of the phase-change medium from the second phase 5 of the phase-change medium back into the first phase 9 of the phase-change medium.

In one or more embodiments disclosed herein, at least one additional supporting member 6 is disposed between and bonded to the first surface and to the second surface, as shown in FIG. 1. The at least one additional supporting member 6 may be provided to prevent deformation of the phase-change chamber, such as may result from a pressure difference between the inside of the phase-change chamber and the outside environment or other forces that may be applied to the phase-change chamber. However, the need for and number of additional support members 6 may depend on the specific geometry of the phase-change chamber 17 and the specific phase-change medium utilized, among other factors.

Figure 2:
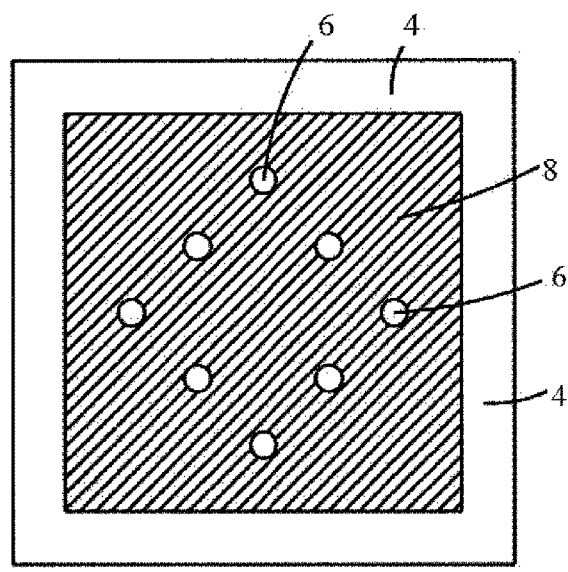
FIG. 2 illustrates the distribution of at least one supporting member along the circumference of the first surface and the second surface and a plurality of additional supporting members disposed between the first surface and the second surface, taken along line II-II in FIG. 1, in accordance with one or more embodiments disclosed herein.

In some embodiments disclosed herein, the geometry of the phase-change chamber 17 is such that the at least one supporting member 4 is sufficient to prevent deformation of the phase-change chamber and no additional supporting member 6 is needed. In other embodiments disclosed herein, the geometry of the phase-change chamber is such that the size of the first plate 3 and the second plate 7 is large enough that a plurality of additional supporting members 6 may be needed to prevent deformation of the phase-change chamber 17, where the additional supporting member 6 may be arranged as shown in FIG. 2. FIG. 2 is an upward, cross-sectional view of an embodiment of the phase-change chamber 17 taken along line II-II in FIG. 1. FIG. 2 further shows the layer 8 of low-affinity to the phase-change medium of the condenser section, also referred to as the second surface. In the case that a plurality of additional supporting members 6 are provided, the plurality of additional supporting members 6 may be arranged symmetrically, asymmetrically, equally-spaced apart, non-equally spaced apart, or in any other arrangement within the phase-change chamber. The specific arrangement of the plurality of additional supporting members 6 may also be limited by a requirement that the additional supporting members 6 do not substantially obstruct lateral movement of the phase-change medium within the phase-change chamber 17.

Further, in one or more embodiments disclosed herein, the at least one additional supporting member 6 may border at least one supporting member 4. In other embodiments disclosed herein, the at least one additional supporting member 6 is non-bordering the at least one supporting member 4. For example, as shown in FIG. 2, the plurality of additional supporting members 6 are non-bordering the at least one supporting member 4, and are arranged in a square pattern.

Figure 3:
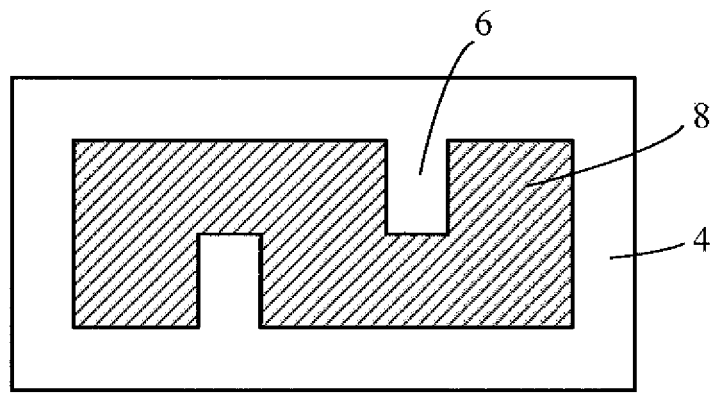
FIG. 3 shows a plurality of additional supporting members disposed between the first surface and the second surface and being an integral part of the at least one supporting member, taken along line II-II in FIG. 1, in accordance with one or more embodiments disclosed herein.

In other embodiments, the at least one additional supporting member may be formed as an integral part of the at least one supporting member 4. For example, the at least one additional supporting member 6 may extend from a location within the phase-change chamber to join the at least one supporting member 4 and to become an integral part of the at least one supporting member 4. Similarly, a plurality of additional supporting members 6 may each extend from a location within the phase-change chamber to join the at least one supporting member 4 and to become an integral part of the at least one supporting member 4, as shown in FIG. 3. FIG. 3 is an upward, cross-sectional view of an embodiment of the phase-change chamber 17 taken along line II-II in FIG. 1. FIG. 3 further shows the low-affinity region of the condenser section, also referred to as the second surface.

One or more embodiments disclosed herein include the at least one supporting member 4, which is bonded with the first surface on the first plate 3 and the second surface on the second plate 7 to seal the phase-change chamber 17, to provide structural support, and to prevent deformation of the phase-change chamber 17. Further, one or more embodiments disclosed herein include the at least one additional supporting member 6, which is bonded with the first surface on the first plate 3 and the second surface on the second plate 7 to provide structural support and to prevent deformation of the phase-change chamber 17.

Figure 4:
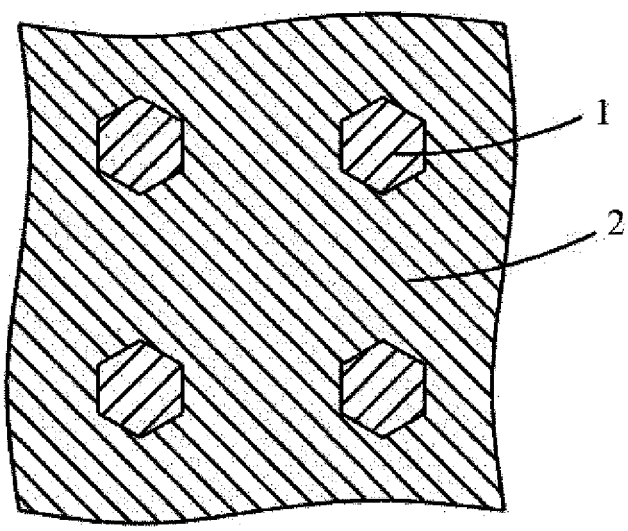
FIG. 4 illustrates the first surface with regions of high and low affinity to the phase-change medium, taken along line I-I in FIG. 1, in accordance with one or more embodiments disclosed herein.

FIG. 4 illustrates a downward, cross-sectional view of an embodiment of the phase-change chamber 17 taken along line I-I in FIG. 1. FIG. 4 shows the layers 1 of low-affinity (low-affinity regions) to the phase-change medium and the layer 2 of high-affinity (high-affinity regions) to the phase-change medium, of the evaporator section of an embodiment of the phase-change chamber 17. For the sake of simplicity, FIG. 4 shows only a small portion of the evaporator section and therefore any additional supporting members 6 have been omitted. As can be seen from FIG. 4, one or more embodiments disclosed herein utilize hexagonal shapes for the low-affinity regions of the first surface. In addition, FIG. 4 illustrates a regular arrangement or patterning of the low-affinity regions and the high-affinity regions. In such a regular arrangement of low-affinity and high-affinity regions, a pitch is defined from the beginning of one low-affinity region to another low-affinity region. In one or more embodiments disclosed herein, a pitch between the low-affinity regions is in the range from 50 to 200 micrometers, such as 60 to 175 or 70 to 150 micrometers, and a size of the low-affinity region is between 40-60% of the pitch.

However, the disclosed embodiments are not limited to a regular arrangement or patterning of the low-affinity regions and the high-affinity regions. In one or more embodiments disclosed herein, the arrangement of the low-affinity regions and high-affinity regions is, for example, only intermittently regular or even completely irregular. Further, the disclosed embodiments are not limited to the pitch and the size of the low-affinity region recited above.

In one or more embodiments disclosed herein, the at least one supporting member 4 along the circumference of the first surface and the second surface may be formed from silicon. In addition, in one or more embodiments disclosed herein, the at least one additional supporting member 6 may be formed from silicon. Further, in one or more embodiments of the claimed invention, the first plate 3 and the second plate 7 may be formed from silicon. In one or more embodiments disclosed herein, the first plate 3 and the second plate 7 have quadratic, rectangular, round, or other shapes.

In one or more embodiments disclosed herein, the high-affinity layer 2 (high-affinity regions of the first surface) includes silicon oxide and is about several hundred nanometers thick, such as 100 to 1000 nanometers in some embodiments, 150 to 750 nanometers in other embodiments, 200 to 500 nanometers in other embodiments, and 250 to 350 nanometers in yet other embodiments; however, other embodiments may utilize silicon oxide layer 2 thicknesses lesser than or greater than 100 and 1000 nanometers, respectively.

In one or more embodiments disclosed herein, the low-affinity layers 1 and 8 (low-affinity regions of the first and second surface, respectively) include polytetrafluoroethylene and may be several tenth to several hundred nanometers thick, such as 50-500 nanometers in some embodiments, 250-500 nanometers in other embodiments, 100-350 nanometers in other embodiments, and 50-100 nanometers in yet other embodiments; however, other embodiments may utilize low affinity layers 1 and 8 having thicknesses lesser than or greater than 50 and 500 nanometers, respectively.

Referring to FIG. 1, one or more embodiments disclosed herein, include a bonding agent layer 15, such as an aluminum layer, positioned under the low-affinity layer 1 (low-affinity regions of the first surface). In addition, one or more embodiments disclosed herein include a second bonding agent layer 16, which may be an aluminum layer, positioned intermediate the low-affinity layer 8 (low-affinity regions of the second surface) and second plate 7. The bonding agent layers 15 and 16 may be provided for improved adhesion of the low-affinity layers 1 and 8 to first and second plates 3 and 7, respectively. While the aluminum layer 16 in FIG. 1 is illustrated as extending only a part of the length of the second plate 7, the aluminum layer 16 can also extend the full length of the second plate 7.

In one or more embodiments disclosed herein, the first and second bonding agent layers 15 and 16 are about several tenth to several hundred nanometers thick, such as 20-250 nanometers in some embodiments, 100-250 nanometers in other embodiments, 20-100 nanometers in other embodiments, and 20-30 nanometers in yet other embodiments; however, other embodiments may utilize aluminum layers 15 and 16 thicknesses lesser than or greater than 20 and 250 nanometers, respectively. The selected thickness of layers 15 and 16 may depend on the overall size of the phase-change chamber 17, manufacturing technique(s) being used to manufacture the phase-change chamber 17, and physical requirements of the phase-change chamber 17, among other factors.

The phase-change medium is capable of transitioning between a plurality of phases. In one or more embodiments disclosed herein, the phase-change medium includes a material selected from the group consisting of water, alcohol, and methanol, and mixtures thereof. However, it is understood by one of ordinary skill in the art that other materials could be utilized as well. Further, it is understood by one of ordinary skill in the art that other materials could be disposed as phase-change medium in the phase-change chamber 17. Moreover, in one or more embodiments disclosed herein, the first phase 9 of the phase-change medium is a liquid phase and the second phase 5 of the phase-change medium is a gaseous phase. However, in yet another embodiment disclosed herein, other phases could be utilized as well, for example a solid phase could be first phase 9 and a gaseous phase could be second phase 5, etc.

Figure 5:
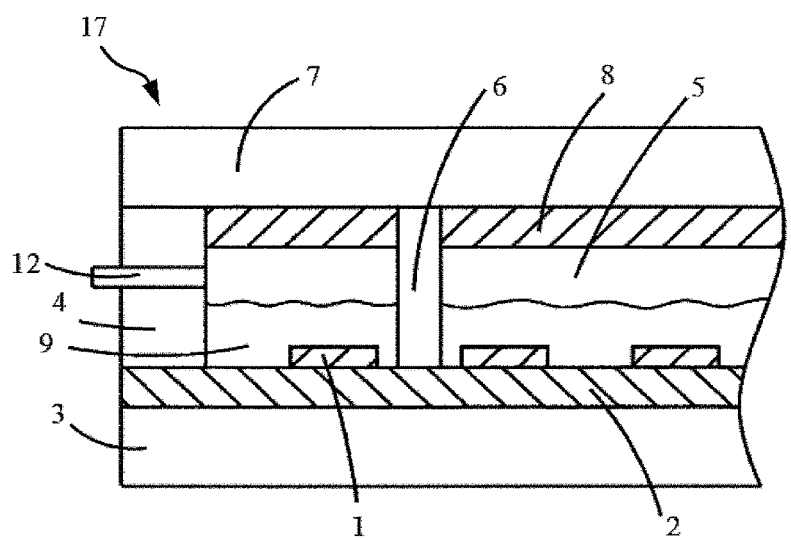
FIG. 5 shows a portion of the phase-change chamber in FIG. 1 and an access port, in accordance with one or more embodiments disclosed herein.

FIG. 5 shows a portion of the phase-change chamber 17 in FIG. 1 and an access port 12, in accordance with one or more embodiments disclosed herein. The access port 12 may be inserted into (provided through) at least one supporting member 4. The access port 12 may be used for evacuating air from the phase-change chamber 17 and to charge the phase-change chamber 17 with the phase-change medium. In one or more embodiments disclosed herein, the access port 12 may be formed from a material selected from the group consisting of copper, glass, and stainless steel, and mixtures thereof. However, it is understood for one of ordinary skill in the art that the access port 12 may also include other materials.

In one or more embodiments disclosed herein, the condenser section of the phase-change chamber 17 may include a surface structure layer between the second plate 7 and the aluminum layer 16. In one or more embodiments disclosed herein, the surface structure layer may include copper oxide and is about several micrometers thick, such as 1 to 10 micrometers in some embodiments, 5 to 10 micrometers in other embodiments, 2 to 5 micrometers in other embodiments, and 1 to 3 micrometers in yet other embodiments; however, other embodiments may utilize copper oxide layer thicknesses lesser than or greater than 1 and 10 micrometers, respectively.

In one or more embodiments disclosed herein, the surface structure layer may include pillars which are etched into the second plate 7. In one or more embodiments disclosed herein, a pillar aspect ratio which is defined as the height of the pillar divided by the space between two adjacent pillars, is a numeric value, such as 0.1 to 10 in some embodiments, 5 to 10 in other embodiments, 1-5 in other embodiments, and 0.1 to 1.0 in yet other embodiments; however, other embodiments may utilize numeric values of the pillar aspect ratio lesser than or greater than 0.1 or 10, respectively.

Description for Fabricating a Phase-change Chamber

Figure 6:
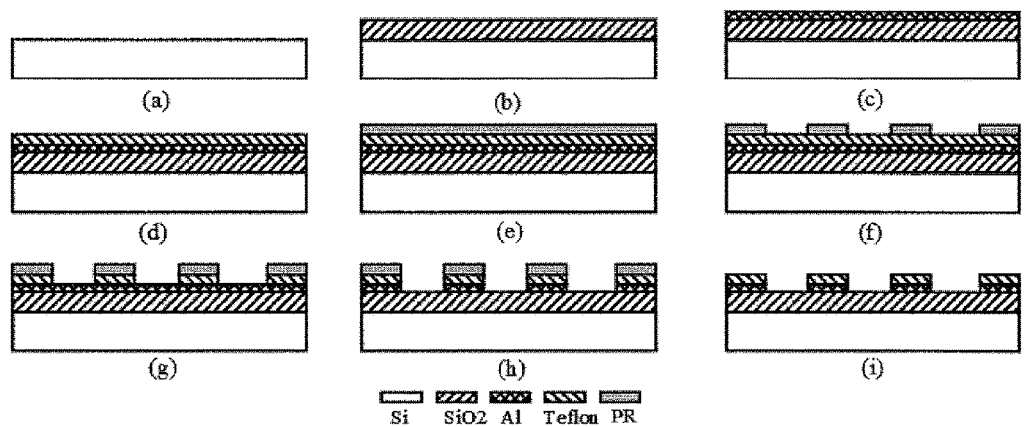
FIG. 6 (inclusive of 6a-6i) shows a method for patterning the high-affinity and low-affinity regions in accordance with one or more embodiments disclosed herein

The thicknesses of individual layers used to fabricate a phase-change chamber in accordance with one or more embodiments disclosed herein have already been recited in the structural description of the phase-change chamber above, therefore for the sake of brevity will not be repeated in this section. Referring back to FIG. 1, one or more embodiments disclosed herein include an evaporator section, a condenser section and a phase-change medium. To fabricate an evaporator section in accordance with one or more embodiments disclosed herein, a crystalline silicon (Si) wafer (a first silicon plate) is utilized as shown in FIG. 6a. The silicon wafer is washed in a wet station, commonly used for microelectronic device fabrication. FIG. 6b illustrates that a layer of silicon oxide (SiO$_2$) is deposited onto the silicon wafer by plasma-enhanced chemical vapor deposition (PECVD). Next, an aluminum (Al) layer is sputtered onto the silicon wafer as can be seen in FIG. 6c. The aluminum layer enhances the adhesion of the polytetrafluoroethylene layer which is subsequently spun on the aluminum layer in FIG. 6d. For example, the polytetrafluoroethylene layer may be spun onto the aluminum layer at 1500 revolutions per minute for 30 seconds, with an acceleration of 500 revolutions per minute. This is followed by baking the wafer at 100° C. for 20 minutes. Next, the photoresist (PR) is spun on the polytetrafluoroethylene layer as shown in FIG. 6e. Subsequently, in FIG. 6f, the photoresist is masked and exposed with UV light as is commonly used for microelectronic device fabrication. In FIG. 6g, the polytetrafluoroethylene layer is removed using an oxygen plasma, in areas where the photoresist does not cover the polytetrafluoroethylene layer. In FIG. 6h, the aluminum layer is dry-etched in areas where no photoresist is present, so that the silicon oxide layer is exposed. At this time, the exposed silicon oxide layer can be optionally rinsed with a diluted solution of buffered hydrofluoric acid (HF) to increase wettability of the silicon oxide layer. Finally, the remaining photoresist is removed using acetone, as shown in FIG. 6i.

Further, FIG. 6i shows the regions of the polytetrafluoroethylene layer, which were masked by photoresist during processing, and which are also referred to as low-affinity regions of the first surface to the phase-change medium, in accordance with one or more embodiments disclosed herein. In addition, FIG. 6i exhibits the regions of the silicon oxide layer, which are also referred to as high-affinity regions of the first surface to the phase-change medium, in accordance with one or more embodiments disclosed herein. Therefore, the process described above, effectively patterns a first surface on a first plate including regions of high and low affinity to a phase-change medium.

To fabricate a condenser section in accordance with one or more embodiments disclosed herein, a silicon (Si) wafer (a second silicon plate) is utilized and an aluminum layer 16 is sputtered onto a second silicon plate 7 as shown in FIG. 1. Then, a polytetrafluoro ethylene layer (layer 8 of low-affinity to the phase-change medium) is spun onto the aluminum layer 16. The polytetrafluoroethylene layer is also referred to as low-affinity region to the phase-change medium. The surface of the low-affinity region including the polytetrafluoroethylene layer of the condenser section is also referred to as a second surface. Therefore, in accordance with one or more embodiments disclosed herein, a second surface is received on a second plate 7 including low-affinity to the phase-change medium.

Referring back to FIG. 1, fabrication of the phase-change chamber 17 further includes bonding another plate (another silicon plate) to the second surface. Bonding of the another plate to the second surface may be achieved via silicon direct bonding (SDB) technique. Next, the another bonded plate is back-etched to the polytetrafluoroethylene layer (layer 8 of low-affinity to the phase-change medium) in order that the at least one supporting member 4 along the circumference of the second surface remains. The silicon removed by back-etching the another plate creates the cavity inside the phase-change chamber 17, which is subsequently backfilled with the phase-change medium. In one or more embodiments disclosed herein, the back-etching is performed in order that at least one additional supporting member 6 remains. In one or more embodiments disclosed herein, the back-etching stops on the polytetrafluoroethylene layer of the condenser. In yet another embodiment disclosed herein, the at least one supporting member 4 along the circumference of the second surface and the at least one additional supporting member 6 are masked using a soft mask (a photoresist mask) prior to back-etching. In a further embodiment disclosed herein, the masking is achieved using a hard mask, for example by utilizing silicon nitride. In yet a further embodiment disclosed herein, anisotropic etching, specifically orientation-dependent etching is used for the back-etching.

Referring to FIG. 5, according to one or more embodiments disclosed herein, the phase-change chamber 17 is fabricated by bonding the at least one supporting member 4 along the circumference of the second surface to the first surface, thereby closing and sealing the phase-change chamber 17. As mentioned above, bonding of the another plate to the second surface may be achieved via silicon direct bonding (SDB) technique. Further, an access port 12 is inserted into the at least one supporting member 4 along the circumference of the first surface and the second surface. To create the access port 12, an opening is etched into the at least one supporting member 4 in which a pipe is inserted. The closed phase-change chamber 17 is evacuated through the access port 12 to remove any gases, and is partially re-filled with phase-change medium. Then, the access port 12 is closed, e.g. by crimping the inserted pipe.

In one or more embodiments disclosed herein, the condenser section of the phase-change chamber 17 may include a surface structure layer between the second plate 7 and the aluminum layer 16. The surface structure layer may include copper oxide and may be obtained by sputtering a layer of copper onto the second plate 7. The second plate 7 with the layer of sputtered copper may be immersed into a solution of potassium persulfate ($K_2S_2O_8$) and potassium hydroxide (KOH) for about one hour at 70° C. to oxidize the sputtered copper into a copper oxide layer with a surface structure.

In one or more embodiments disclosed herein, the surface structure layer may include pillars which are etched into the second plate 7. The pillars may be etched directly into the second plate 7, using isotropic, anisotropic, wet or dry etch methods.

One of ordinary skill in the art would know and appreciate that the above-described fabrication method for a phase-change chamber can be modified in several aspects. For example dry-etch and wet etch techniques are often interchangeable. Further, masking can be achieved using "soft" photoresist mask or "hard" masks, e.g. silicon nitride. In addition, deposition of materials can be achieved by multiple techniques, among them physical vapor deposition (PVD), e.g. sputtering or thermal evaporation, and chemical vapor deposition (CVD), e.g. glow discharge, low-pressure chemical vapor deposition, or microwave-enhanced chemical vapor deposition.

Operational Description of a Phase-change Chamber

Figure 7:
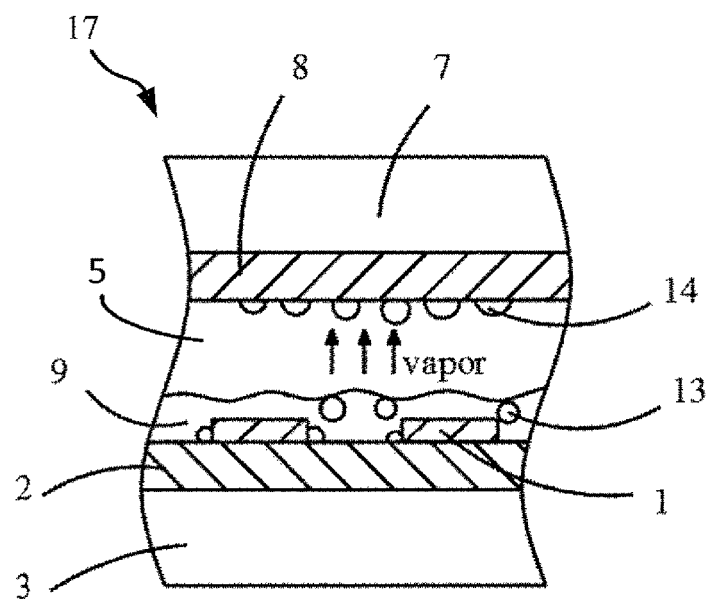
FIG. 7 shows a portion of the phase-change chamber in FIG. 1, illustrating the working principle, in accordance with one or more embodiments disclosed herein

In reference to FIG. 7, the operation of a phase-change chamber, in accordance with one or more embodiments disclosed herein, will now be explained. FIG. 7 shows a portion of a cross-sectional view of a phase-change chamber 17. For the sake of operational description, it is assumed that first plate 3 is in thermal contact with a heat source (not shown) and further, second plate 7 is in thermal contact with a heat sink (not shown). The objective is to transfer the heat, generated by the heat source, to the phase-change chamber 17 and from there to the heat sink, which in turn dissipates the heat to the environment.

Heat generated from the heat source is conducted to the first plate 3 and through the layer 2 of high-affinity to the phase-change medium as well as through the aluminum layer 15 and the layer 1 of low-affinity to the phase-change medium to the first phase 9 of the phase-change medium. In one or more embodiments disclosed herein, the first phase 9 of the phase-change medium is a liquid. When the liquid in the evaporator section absorbs heat, the liquid will boil and evaporate at a relatively low temperature, in accordance with the pressure in the phase-change chamber 17. According to FIG. 7, bubbles 13 will nucleate at the interface between patterned high-affinity regions and low-affinity regions, thereby increasing the heat transfer coefficient. Specifically, the low-affinity regions at the interface between patterned high-affinity regions and low-affinity regions serve as nucleation sites and facilitate the onset of nucleate boiling and therefore encourage nucleation. Further, the low-affinity regions at the interface between patterned high-affinity regions and low-affinity regions accelerate the departure of small bubbles.

Because of the latent heat of vaporization, heat is removed from the first surface of the evaporator as a result of vaporizing the liquid. In one or more embodiments disclosed herein, the produced vapor constitutes the second phase 5 of the phase-change-medium. The produced vapor rises upward as indicated by the arrows in FIG. 7 until the vapor reaches the relatively colder second surface of the condenser.

Once the vapor reaches the relatively colder second surface of the condenser, the vapor condenses back into a liquid and condensate 14 is formed on the second surface of the condenser. As a result of condensation, heat is transferred from the vapor to the second surface of the condenser and is conducted through the layer 8 of low-affinity to the phase-change medium and aluminum layer 16 into the second plate 7. The second plate 7 in turn conducts the heat to a heat sink (not shown) which in turn dissipates the heat to the environment.

Further, because of the second surface of the condenser has a low-affinity to the phase-change medium, the condensate 14 forms drop-wise on the second surface and thus greatly enhances the condensation heat transfer efficiency. In addition, the droplets of the condensate 14 facilitate a drop-down by gravity back to the evaporator section where they replenish the liquid phase.

In one or more embodiments disclosed herein, the condenser section of the phase-change chamber 17 may include a surface structure layer between the second plate 7 and the aluminum layer 16. In this case, the surface structure layer causes that a static contact angle, which is an angle measured through a liquid, where a liquid/vapor interface meets a solid surface, is much larger than that of a surface without the surface structure layer. Consequently, the condensate 14 drops more quickly back to the evaporator section and the condensation efficiency is enhanced.

The high-affinity regions of the evaporator section help to draw the condensate 14 back to the center of the evaporator section to prevent dry-out, thereby increasing the critical heat flux. The cycle of evaporation and condensation of the phase-change medium will repeat continuously to transfer heat from a heat generating electronic component to the surrounding environment.

Description of a Heat Dissipation Apparatus

Figure 8:
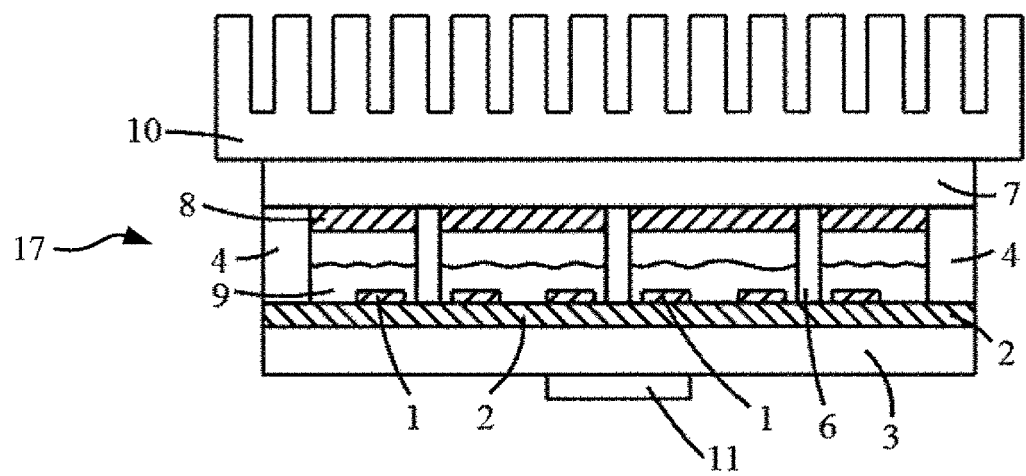
FIG. 8 shows a heat dissipation apparatus with a phase-change chamber in accordance with one or more embodiments disclosed herein.

With reference to FIG. 8, a heat dissipation apparatus in accordance with one or more embodiments disclosed herein includes a heat source 11. The heat source 11, which is generating an amount of heat flux, could be, for example, an electronic device such as a GPU, CPU, APU, DRAM, VIM, Chipset or LED. However, one or ordinary skill in the art would know and appreciate that any other device in need of cooling could be utilized as part of the heat dissipation apparatus as well. The heat source 11 is in thermal contact with the first plate 3 of a phase-change chamber 17 in accordance with one or more embodiments disclosed herein, and the second plate 7 of the phase-change chamber is in thermal contact with a heat sink 10. The heat sink 10 dissipates the heat flux to the environment.

It is understood that thermal contact between the heat source 11 and the phase-change chamber 17 can be realized by multiple techniques. In one embodiment disclosed herein, thermal contact between the heat source 11 and the phase-change chamber 17 is achieved by utilizing a thermally conductive interface material positioned between the first plate 3 of the phase-change chamber 17 and the heat source 11. In another embodiment disclosed herein, thermal contact between the heat source 11 and the phase-change chamber 17 is established by employing the silicon direct-bonding technique. In yet another embodiment disclosed herein, the heat source 11 consists of a silicon die mounted in flip-chip technology, and thermal contact between the heat source 11 and the phase-change chamber 17 is realized by using the silicon die as the first plate 3. In yet another embodiment disclosed herein, the backside of the flip-chip die has been ground to reduce the thickness of silicon through which heat is conducted to the phase-change chamber 17.

Referring to FIG. 8, it is further understood that thermal contact between the phase-change chamber 17 and the heat sink 10 can be realized by multiple techniques. In one or more embodiments disclosed herein, a thermally conductive interface material is positioned between the second plate 7 of the phase-change chamber and the heat sink 10. The heat sink 10 may include a material selected from the group consisting of copper and aluminum, and mixtures thereof. However, one or ordinary skill in the art would know that other materials could be used for the heat sink 10 as well. Moreover, one of ordinary skill in the art would realize that the heat sink 10 could be exchanged for a Peltier element or another heat pipe could be used to transfer the heat to a heat sink elsewhere.

While the disclosed embodiments have been described with respect to a limited number of embodiments, those skilled in the art, having benefit of this disclosure, will appreciate that other embodiments can be devised which do not depart from the scope of the disclosed embodiments herein. Accordingly, the scope of the disclosed embodiments should be limited only by the attached claims.

What is claimed is:

1. A phase-change chamber, comprising:
   a phase-change medium capable of transitioning between a plurality of phases;
   a first surface for transitioning a portion of the phase-change medium from a first phase into a second phase;
   a second surface for transitioning a portion of the phase-change medium from the second phase into the first phase;
   at least one supporting member along a circumference of the first surface and the second surface for separating and enclosing the first surface and the second surface, wherein
       the first surface is patterned on a first plate and comprises regions having high and low affinity to the phase-change medium, and
       the second surface is received on a second plate and has low affinity to the phase-change medium; and
   an access port inserted into the at least one supporting member along the circumference of the first surface and the second surface,
   wherein the phase-change chamber is a wickless phase-change chamber.

2. The phase-change chamber according to claim 1, wherein at least one additional supporting member is disposed between the first surface and the second surface and is a) bordering the at least one supporting member, b) non-bordering the at least one supporting member, or c) an integral part of the at least one supporting member.

3. The phase-change chamber according to claim 2, wherein a plurality of the additional supporting members non-bordering the at least one supporting member are arranged in a square.

4. The phase-change chamber according to claim 2, wherein the at least one additional supporting member is bonded with the first surface on the first plate and the second surface on the second plate to provide structural support and to prevent deformation of the phase-change chamber.

5. The phase-change chamber according to claim 2, wherein the at least one additional supporting member comprises silicon.

6. The phase-change chamber according to claim 1, wherein the at least one supporting member is bonded with the first surface on the first plate and the second surface on the second plate to seal the phase-change chamber, to provide structural support, and to prevent deformation of the phase-change chamber.

7. The phase-change chamber according to claim 1, wherein the at least one supporting member along the circumference of the first surface and the second surface comprises silicon.

8. The phase-change chamber according to claim 1, wherein the first plate comprises silicon.

9. The phase-change chamber according to claim 1, wherein the second plate comprises silicon.

10. The phase-change chamber according to claim 1, wherein the high-affinity regions of the first surface comprise a silicon oxide layer.

11. The phase-change chamber according to claim 10, wherein the silicon oxide layer is deposited onto the first plate.

12. The phase-change chamber according to claim 10, wherein the thickness of the silicon oxide layer is between 100 and 1000 nanometers.

13. The phase-change chamber according to claim 1, wherein the low-affinity regions of the first surface are hexagonal in shape.

14. The phase-change chamber according to claim 1, wherein the low-affinity regions of the first surface and of the second surface comprise polytetrafluoroethylene.

15. The phase-change chamber according to claim 14, wherein a thickness of the polytetrafluoroethylene layer is between 50 and 500 nanometers.

16. The phase-change chamber according to claim 14, wherein an aluminum layer is positioned under the polytetrafluoroethylene layer.

17. The phase-change chamber according to claim 16, wherein a thickness of the aluminum layer is between 20 and 250 nanometers.

18. The phase-change chamber according to claim 16, wherein a surface structure layer is positioned under the aluminum layer of the second surface.

19. The phase-change chamber according to claim 18, wherein the surface structure layer comprises copper oxide.

20. The phase-change chamber according to claim 19, wherein a thickness of the copper oxide layer is between 1 and 10 micrometers.

21. The phase-change chamber according to claim 18, wherein the surface structure layer comprises pillars etched into the second plate.

22. The phase-change chamber according to claim 21, wherein a pillar aspect ratio is a numeric value between 0.1 and 10.

23. The phase-change chamber according to claim 1, wherein a pitch between the low-affinity regions is in the range from 50 to 200 micrometers, and a size of the low-affinity region is between 40% and 60% of the pitch.

24. The phase-change chamber according to claim 1, wherein the phase-change medium comprises a material selected from the group consisting of water, alcohol, and methanol, and mixtures thereof.

25. The phase-change chamber according to claim 1, wherein the access port comprises a material selected from the group consisting of copper, glass, and stainless steel, and mixtures thereof.

* * * * *